(12) United States Patent
Azdasht

(10) Patent No.: US 6,713,714 B1
(45) Date of Patent: Mar. 30, 2004

(54) METHOD AND DEVICE FOR THERMALLY CONNECTING THE CONTACT SURFACES OF TWO SUBSTRATES

(75) Inventor: Ghassem Azdasht, Berlin (DE)

(73) Assignees: Pac Tech-Packaging Technologies GmbH, Nauen (DE); Smart Pac GmbH Technology Services, Nauen (DE); part interest ( * ) Notice: Subject to any disclaimer, the term of this patent is extended or adjusted under 35 U.S.C. 154(b) by 0 days.

(21) Appl. No.: 09/889,677
(22) PCT Filed: Jan. 12, 2000
(86) PCT No.: PCT/DE00/00084
§ 371 (c)(1), (2), (4) Date: Jul. 17, 2001
(87) PCT Pub. No.: WO00/41834
PCT Pub. Date: Jul. 20, 2000

(30) Foreign Application Priority Data

Jan. 18, 1999 (DE) .......................................... 199 01 623

(51) Int. Cl.[7] .............................................. B23K 26/20
(52) U.S. Cl. ............................. 219/121.64; 156/272.8; 219/121.63
(58) Field of Search ....................... 219/121.63, 121.64; 156/272.8

(56) References Cited

U.S. PATENT DOCUMENTS

| | | | |
|---|---|---|---|
| 4,906,812 A | 3/1990 | Nied et al. | |
| 5,489,551 A | * | 2/1996 | Castleberry |
| 6,284,086 B1 | * | 9/2001 | Cardellino et al. |
| 6,394,158 B1 | * | 5/2002 | Momeni ................ 219/121.64 |

FOREIGN PATENT DOCUMENTS

| | | | |
|---|---|---|---|
| DE | 4013569 A1 | * | 10/1991 |
| DE | 44 46 289 A1 | | 6/1996 |
| DE | 195 04 967 A1 | | 8/1996 |
| DE | 195 20 336 A1 | | 12/1996 |
| DE | 195 44 480 A1 | * | 2/1997 |
| DE | 197 49 909 A1 | | 6/1998 |
| EP | 0 387 066 A1 | | 9/1990 |
| EP | 0 756 323 A2 | | 1/1997 |
| JP | 60 162 574 A | | 8/1985 |
| JP | 61 219 467 A | | 9/1986 |
| JP | 62-142092 A | * | 6/1987 |
| JP | 05-259-220 A | | 1/1994 |
| JP | 7-106490 A | * | 4/1995 |
| JP | 07 142 854 A | | 6/1995 |
| WO | WO 95/00283 A1 | * | 1/1995 |
| WO | WO 97/12714 A | | 9/1996 |
| WO | WO 99/26753 A1 | * | 6/1999 |

* cited by examiner

*Primary Examiner*—Geoffrey S. Evans
(74) *Attorney, Agent, or Firm*—McGlew and Tuttle, P.C.

(57) ABSTRACT

A method and a device for thermally connecting the terminal areas (26, 27) of a contact substrate (11) to the terminal areas (28, 29) of a carrier substrate (12), where the substrates (11, 12) are, in order to produce the connection, arranged in a connecting position such that the terminal areas (26, 28; 27, 29) are situated opposite one another in the plane of the connection, where the contact substrate (11) is heated to the connecting temperature from its rear side that is situated opposite the terminal areas (26, 27) in order to reach the required connecting temperature in the plane of the connection, and where the contact substrate (11) is heated by subjecting the substrate to laser energy.

10 Claims, 3 Drawing Sheets

METHOD AND DEVICE FOR THERMALLY CONNECTING THE CONTACT SURFACES OF TWO SUBSTRATES

This application is a 371 of PCT/DE00/00084, filed Jan. 12, 2000.

FIELD OF THE INVENTION

The present invention relates to a method for thermally connecting the terminal areas of a contact substrate to the terminal areas of a carrier substrate, wherein the substrates are, in order to produce the connection, arranged in a connecting position such that the terminal areas are situated opposite one another in the plane of the connection, and wherein the contact substrate is heated to the connecting temperature from its rear side that is situated opposite the terminal areas in order to reach the required connecting temperature in the plane of the connection. The present invention also relates to a device that is suitable for carrying out this method.

BACKGROUND OF THE INVENTION

In order to contact the terminal areas of a substrate with the terminal areas of another substrate, for example, to contact a chip on a carrier substrate, it is known to heat the chip from its rear side after it has been transferred into a connecting position in which it is connected to the carrier substrate and the chip terminal areas are situated opposite the assigned terminal areas of the carrier substrate. This is carried out in order to beat the chip terminal area arranged on the side situated opposite the rear side of the chip to the connecting temperature by means of thermal conduction, namely in such a way that a connecting material arranged between the chip terminal areas and the terminal areas of the substrate is heated to the melting temperature and an integral electric connection between the terminal areas is produced.

It is also known to utilize for this purpose connecting or contacting devices that contain a so-called "thermode", i.e. an electric heating resistor that emits a high loss of heat when an electric current is applied, in particular, in a thermode contact region of usually tapered crosssection. This heat loss is utilized for heating the rear side of the substrate, e.g. the clip. Since the heat transfer from the thermode to the chip takes place in the form of thermal conduction, the thermal resistance between the different elements, i.e. the thermode and the chip, has disadvantageous effects on the time required for reaching the connecting temperature in the chip. With respect to practical applications, this means that, although the thermode can be heated to the required temperature within a few milliseconds, the time required for heating the chip to the connecting temperature amounts to a multiple thereof, in the region of 5–10 seconds, due to the thermal resistance between the thermode and the chip. The thermode contact region is also frequently deformed due to its high temperature load such that the surface contact with the chip is diminished and the thermal resistance that has disadvantageous effects on the heat-up time is further increased.

In addition, longer heat-up times of the chip that are caused by the significantly higher thermal capacity of the thermode in comparison to that of the chip can also be observed in practical applications.

Due to the long heat-up time required for reaching the connecting temperature in the chip or in the terminal areas of the chip, respectively, the known method is not suitable for use with substrates that are sensitive to high temperatures, e.g., substrates of PVC or polyester. Consequently, it is not possible to utilize the known method in the manufacture of chip cards, in which chips are arranged on carrier substrates of PVC, polyester or similar temperature-sensitive materials.

JP-A-60 162 574 describes a device for subjecting the rear side of a chip component to laser energy that is supplied via a glass fiber and focused by means of a lens. The chip component is held in position by a negative pressure device. The negative pressure device is realized separately of the glass fiber channel.

WO 97/12714 describes a device for selectively soldering in or soldering out components in a contactless fashion. In this device, the light of an infrared lamp is directed onto a component by a rigid quartz glass tube. The tube interior serves for subjecting the component to a vacuum such that the component can be held on the quartz glass tube.

U.S.-A-4,906,812 describes a soldering device in which the laser light is directed onto the soldering point by means of a glass fiber. A separate supply line and a separate discharge line for gases which lead to and from the soldering point are provided for transporting away soldering vapors.

JP-A-61 219 467 describes a device for mounting a flexible printed circuit board on another printed circuit board. The flexible printed circuit board is held by means of a vacuum device while the contact points are heated through separate channels by means of laser light supplied via a glass fiber.

JP-A-07 142 854 describes a device for attaching integrated circuits to a substrate. The electronic circuits are moved into the corresponding position and held therein by a vacuum pipette. The laser light emitted by a movably mounted laser heats the connecting lugs.

SUMMARY AND OBJECTS OF THE INVENTION

The present invention is based on the objective of proposing a method and a device which make it possible to produce a connection, of the initially described type also when temperature-sensitive substrates are used and to ensure that a particularly durable and stable connection is produced, namely while simultaneously sealing the contact region.

This objective is attained with a method and a device according to the invention. The contact substrate is heated due to the fact that laser energy acts upon the substrate. In this event, the energy introduction into the chip which is required for heating the contact substrate, e.g., the chip, is realized in the form of an absorption of the laser radiation in the chip, i.e., the thermal energy only manifests itself within the chip. In the method according to the invention, the thermal transmission resistance that results in the initially described disadvantages with respect to the heat-up time of the chip does not occur. This means that the heat-up time is significantly reduced such that a significantly lower thermal load for both substrates results. Consequently, the sensitive carrier substrate is not endangered, in particular, in the manufacture of chip cards. Due to the relatively low thermal load, the material of the carrier substrate can be selected according to needs. In addition to plastic substrates, even paper substrates may be considered. The risk of doping changes in the chip structure as they occur under excessively high thermal loads also is significantly reduced. Since the chip terminal areas are heated by heating the structure of the contact substrate, it is no longer necessary to focus the laser radiation onto the chip terminal areas, i.e., a corresponding focusing device can be eliminated. A displacement of an adhesive material arranged between the substrates in the plane of the connection takes place simultaneously with the arrangement of the substrates in the connecting position and the subsequent production of the thermal connection between the terminal areas of the substrates. This is particularly effective because a separate production step for subsequently sealing the gap between the substrates is no longer required. A connection between the two substrates which is particularly durable because it is protected from environmental corrosive effects can be achieved in this fashion.

Superior results, in particular, with respect to a largely uniform gap formation between the contact surfaces of the substrates can be achieved if the rear side of the contact substrate is supported during the heating of the substrate and the contacting of the substrate terminal areas that are situated opposite one another, with the support being realized in such a way that at least partial surface regions of the rear side are supported which lie outside of the energy surface upon which the laser energy acts.

The method according to the invention can be carried out in a particularly effective fashion if the support is at least partially realized with the aid of a contact surface of a contacting device that serves for connecting or for accommodating a glass fiber.

When carrying out the connecting method it has proved to be particularly advantageous to subject the substrate to a negative pressure via the contact surface in order to transfer the substrate into the connecting position. With such a measure, it is possible to produce the connection and to handle the contact substrate with one and the same device.

The contacting device according to the invention is for producing a thermal connection between the terminal areas of two substrates that are arranged opposite one another in a plane of connection. The contacting device is provided with a contact mouthpiece that serves for producing a connection with at least one glass fiber section. The contact mouthpiece contains a negative pressure device that is connected to a negative pressure opening in a contact surface of the contact mouthpiece. Due to this measure, the contacting device according to the invention not only makes it possible to heat the substrate by induction of the connecting heat in the substrate, but to also handle the substrate to be contacted. This means that a particularly effective production of the connection between the two substrates can be achieved.

The connection between the at least one glass fiber end section and the contact mouthpiece is realized with the aid of a fiber holding device, and the contact mouthpiece is provided with a number of glass fiber accommodation channels which corresponds to the number of glass fibers used, with the glass fiber accommodation channels opening into the contact surface such that a particularly exact alignment and defined arrangement of the at least one glass fiber end section relative to the contact substrate can be achieved. In this case, the fiber end crosssections of the glass fiber end sections may be arranged at a distance from the contact surface of the contact mouthpiece or flush with this contact surface.

The glass fiber accommodation channel or the glass fiber accommodation channels simultaneously serve for forming negative pressure lines of the negative pressure device, i.e., the contact mouthpiece can be designed in a particularly simple fashion.

In instances in which the fiber end cross-sections of the glass fiber end sections are, in particular, arranged flush with the contact surface of the contact mouthpiece, it is advantageous to provide the fiber holding device with a fiber advancing unit. This fiber advancing unit may be realized integrally with the fiber holding device or separately thereof.

The design of the contact mouthpiece can be further simplified if the fiber holding device is provided with a pressure connection for the negative pressure device such that the fiber holding device simultaneously fulfills two functions in this case.

An embodiment of the contacting device which has a particularly low maintenance requirement achieved if the fiber holding device serves for accommodating at least one glass fiber end section in such a way that a fiber end cross-section is arranged at a distance from the contact surface of the contact mouthpiece. Due to this measure, a direct contact between the fiber end cross-section and the substrate to be heated is prevented. Consequently, the fiber end cross-section is not heated such that possible soiling of the fiber end cross-section resulting therefrom is prevented.

If the contact mouthpiece is realized in the form of a capsule-like hollow body that contains the negative pressure opening in the contact surface and a pressure connection in its surface, an embodiment of the contacting device is achieved which is designed in a particularly simple fashion and can be easily manufactured.

Preferred variations of the method according to the invention and preferred embodiments of the device according to the invention are described in greater detail below with reference to the drawings.

The various features of novelty which characterize the invention are pointed out with particularity in the claims annexed to and forming a part of this disclosure. For a better understanding of the invention, its operating advantages and specific objects attained by its uses, reference is made to the accompanying drawings and descriptive matter in which preferred embodiments of the invention are illustrated.

DESCRIPTION OF THE PREFERRED EMBODIMENTS

Figure 1:
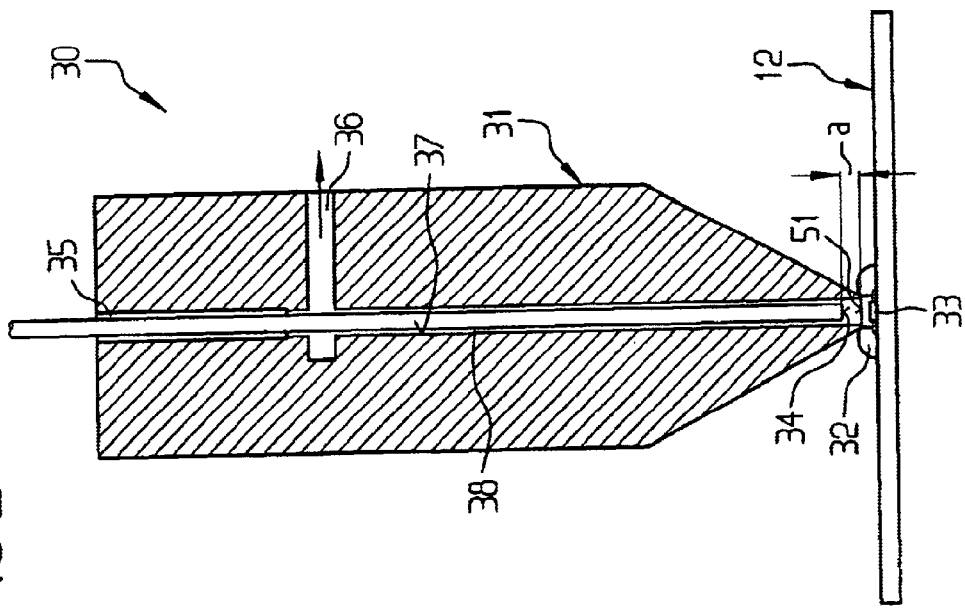
FIG. 1 is a front sectional view showing a contacting device immediately before a contact substrate is disposed in contact with a carrier substrate.

Referring to the drawings in particular, FIG. 1 schematically shows a contacting device that serves for contacting a contact substrate, in this case a chip 11, on a carrier substrate 12. Contacting device 10 contains a contact mouthpiece 13 that is provided with a contact surface 14 on its lower end. The end section 15 of a glass fiber 16 that is situated in a glass fiber accommodation channel 17 extends through the contact mouthpiece 13 in the longitudinal direction of the contact mouthpiece 13. The end section 15 of glass fiber 16 is held in a fiber holding device 19 with its upper part 18, with the fiber holding device being arranged on the upper end of the contact mouthpiece 13. In the example shown, the fiber holding device 19 is provided with a fiber fixing arrangement 20 that defines the glass fiber 16 in its position relative to the contact mouthpiece 13. The fiber holding device is also provided with a lateral connection piece 21 that serves for producing a connection with a negative pressure source that is not illustrated in detail. The fiber holding device 19 has an inside diameter that is larger than the fiber diameter such that an annular gap 22 is formed in the fiber holding device 19. Since the bore diameter of the glass fiber accommodation channel 17 is also larger than the fiber diameter, this annular gap transforms into an annular channel gap 23 such that a negative pressure is present within the region of an opening 24 of the glass fiber accommodation channel 17 which opening is situated in the contact surface 14. Due to this negative pressure, the rear side 25 of the chip 11 is held against the contact surface 14 of the contact mouthpiece 13 when a negative pressure is applied to the glass fiber accommodation channel 17 as shown in FIG. 1.

In this way, it is possible to transfer chip 11 from a chip reservoir (not shown) or similar into the starting position according to FIG. 1 for producing a connection between chip 11 and carrier substrate 12. In this starting position, the chip terminal areas 26, 27 of chip 11 are situated opposite the assigned terminal areas 28, 29 of the carrier substrate 12.

FIG. 1 shows that an adhesive material deposit 32 is deposited onto the carrier substrate 12 in the starting position in such a way that terminal areas 28 and 29 of the carrier substrate 12 are covered. In this starting position, chip 11 is still situated a certain distance above carrier substrate 12.

Figure 2:
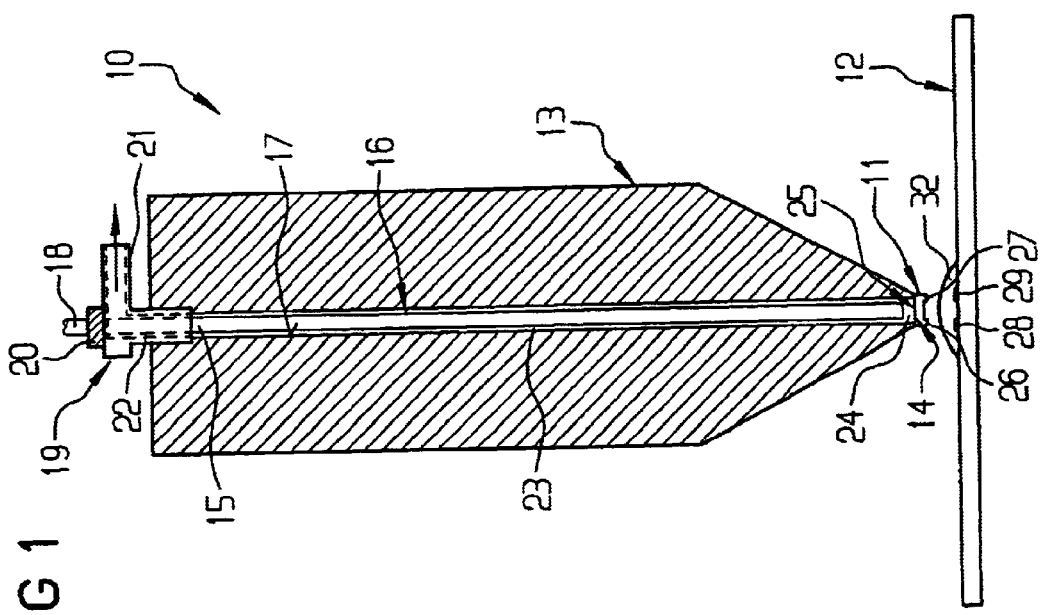
FIG. 2 is a front sectional view showing another embodiment of a contacting device during the disposition in contact of the contact substrate according to FIG. 1 on the carrier substrate.

FIG. 2 shows a contacting device 30 that is modified in comparison to the contacting device 10 according to FIG. 1. The contacting device is situated in the connecting position in which a contact mouthpiece 31 with a chip 11 that adheres to the contact surface 14 due to a negative pressure is moved toward the carrier substrate 12 in such a way that the chip terminal areas 26, 27 come in contact with the assigned terminal areas 28, 29 of the carrier substrate 12. Due to the formation of this contact, the adhesive material deposit 32 is displaced as shown in FIG. 2, namely in such a way that the gap 33 formed between the chip 11 and the carrier substrate 12 is filled in a sealed fashion with the adhesive material 32 of the adhesive material deposit. On the periphery of the chip 11, the adhesive material deposit 32 simultaneously forms a bead such that a particularly reliable lateral seal of the gap 33 is achieved.

The heating of the chip 11, as well as the chip terminal areas 26, 27 connected to the chip 11, and the heating of the terminal areas 28, 29 of the carrier substrate 12 which are in contact with the chip terminal areas 26, 27 takes place in the connecting position shown in FIG. 2.

As in the embodiment of the contacting device 10 which is shown in FIG. 1, the end section 15 of the glass fiber 16 is also situated in a glass fiber accommodation channel 17 in the contacting device 30. In this case, the fiber end cross-section 34 of the glass fiber 16 is, however, spaced apart froth the rear side 25 of the chip 11 by a distance a. The glass fiber 16 is connected to a laser source that is not illustrated in detail and emits laser radiation into the glass fiber 16. The laser radiation emerges from the fiber end cross-section 34 and is introduced into the chip structure of the chip 11 via the rear side 25 of the chip 11. The radiation energy is converted into thermal energy due to the absorption of the laser radiation in the chip structure such that the chip 11 and consequently the chip terminal areas 26, 27 which are connected to the chip, as well as the terminal areas 28, 29 that are in contact with the chip terminal areas 26, 27, are heated to the connecting temperature. The chip terminal areas 26, 27 and/or the terminal areas 28, 29 of the carrier substrate 12 are conventionally provided with a meltable connecting material that melts when the chip 11 is heated and produces a rigid integral connection between the chip 11 and the carrier substrate 12 after it solidifies. The temperature of the adhesive material deposit 32 also increases simultaneously with the heating of the chip terminal areas 26, 27 and the terminal areas 28, 29. If the material composition of the adhesive material deposit 32 is chosen accordingly, this temperature increase of the adhesive material leads to a hardening or at least an accelerated hardening of the adhesive material deposit 32.

FIG. 1 shows that the rear side 25 of chip 11 is supported by surrounding surface regions of the contact surface 14 outside of an energy surface 51 that is covered by the opening 24 and through which the energy introduction into the chip 11 takes place.

In contrast to the contacting device 10 according to FIG. 1, the contacting device 30 shown in FIG. 2 contains a few modifications that, however, have no effect on the previously described method, i.e., either the contacting device 10 or the contacting device 30 can be utilized for positioning the chip 11 in the starting position shown in FIG. 1 and for producing the connection between the chip 11 and the carrier substrate 12 in the connecting position shown in FIG. 2.

In contrast to the contacting device 10, the contacting device 30 contains a fiber holding device 35 that is integrated into the body of the contact mouthpiece 31. In addition, the contacting device 30 contains a pressure connection 36 that is realized in the form of a transverse bore in the body of the contact mouthpiece 31 and serves for producing a negative pressure connection with the opening 24 in the contact mouthpiece 31 via an annular channel gap 38 that is formed between the fiber end section 15 and the glass fiber accommodation channel 37.

Figure 3:
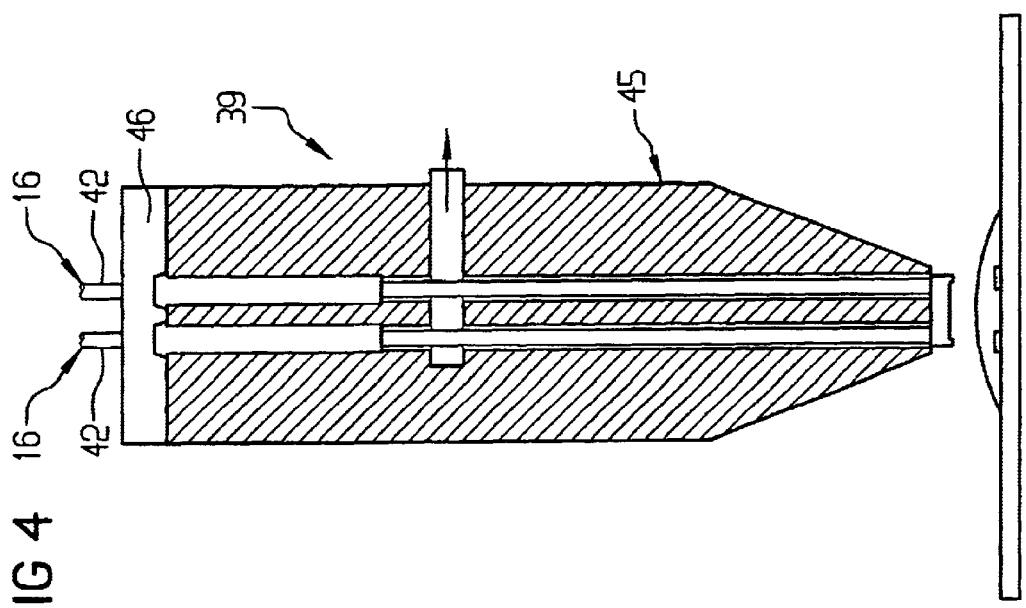
FIG. 3 is a front sectional view showing another embodiment of the contacting device with two glass fibers immediately before a contact substrate is disposed in contact with a carrier substrate.

FIG. 3 shows a contacting device 39 in its starting position above the carrier substrate 12. In contrast to contacting devices 10 and 30, this contacting device is provided with two glass fibers 16, such that fiber end sections 42 are arranged in parallel glass fiber accommodation channels 40, 41 at a distance "a" between their fiber end cross-sections 34 and the rear side 43 of a chip 44. In order to fix the position of the fiber end sections 42 relative to a contact mouthpiece 45 of contacting device 39, fiber end sections 42 are guided through a fiber holding device 46 that is connected to the upper end of the contact mouthpiece 45.

Figure 4:
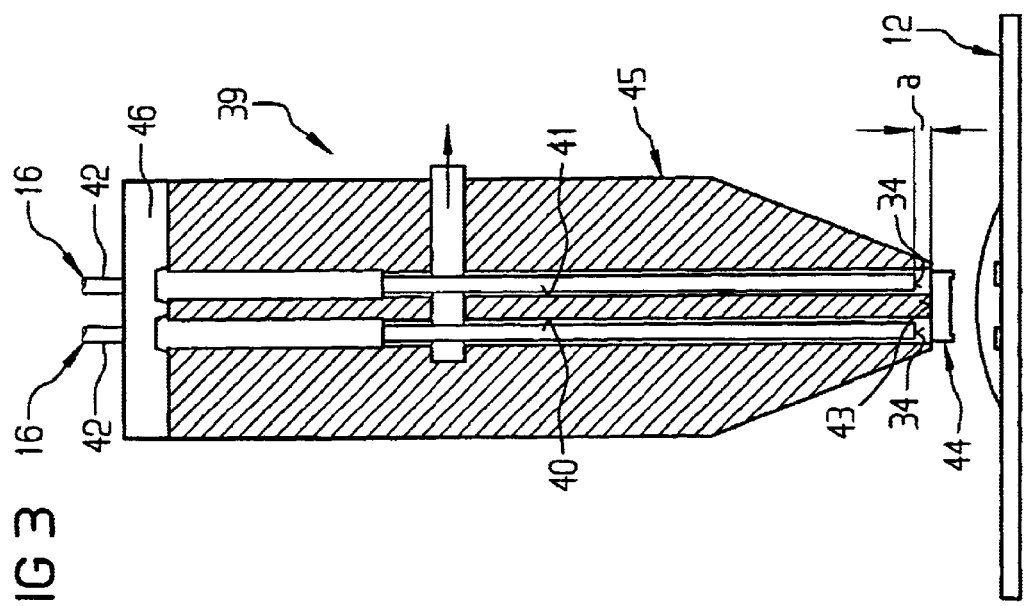
FIG. 4 is a front sectional view showing the contacting device according to FIG. 3 with an arrangement of the glass fibers that is modified in comparison to FIG. 3, namely immediately before the disposition of the contact substrate on the carrier substrate.
Figure 5:
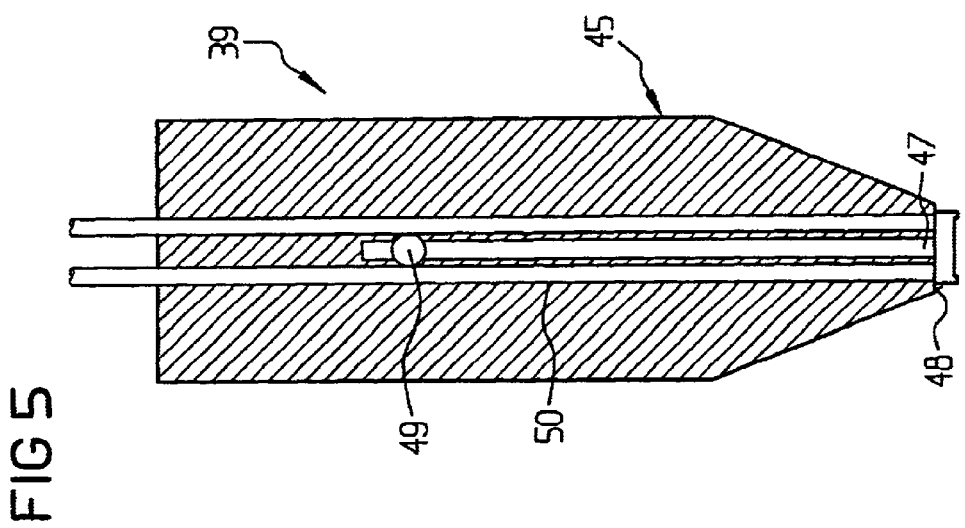
FIG. 5 is a side sectional view of the contacting device shown in FIG. 4.

FIG. 5 shows that a connecting line in the form of a negative pressure channel 49 that is realized independently of the glass fiber accommodation, channels 40, 41 is formed in the contacting device 39 between an opening 47 in the contact surface 48 on the lower end of the contact mouthpiece 45 and a pressure connection 49 that is realized in the form of a transverse bore in the contact mouthpiece 45. The embodiments of the contacting device 39 shown in FIGS. 3, 4 and 5 are particularly suitable for producing a connection between a larger chip 44 or a larger substrate and a carrier substrate 12. On the other hand, the contacting devices 10 and 30 shown in FIGS, 1 and 2 which contain only one glass fiber 16 are better suited for contacting smaller chips, e.g., in the manufacture of chip cards.

A comparison of FIGS. 3 and 4 shows that the contacting device 39 makes it possible to arrange the fiber end cross-sections 34 of the glass fiber 16 at a distance "a" from the rear side 43 of the chip 44 (FIG. 3) or directly adjacent to the rear side 43 of the chip 44 as illustrated in FIG. 4 depending on the adjustment of the position of the fiber end sections 42 relative to the fiber holding device 46. In the configuration of the glass fibers 16 in the contact mouthpiece 45 which is shown in FIG. 4, it is particularly advantageous to combine the fiber holding device 46 with a fiber advancing unit that is not illustrated in detail and makes it possible to advance the fiber in order to compensate possible wear phenomena on the fiber end cross-sections 34.

Analogous to the contacting device 39 that is shown in FIGS. 3, 4 and 5 and makes it possible to accommodate several glass fibers 16, it would naturally also be possible to provide the contacting devices 10 and 30 shown in FIGS. I and 2 with fiber holding devices that are equipped with fiber advancing units. This would make it possible to configure the glass fiber 16 in the contact mouthpiece 13 or in the contact mouthpiece 31 such that the fiber end cross-section 34 adjoins the rear side 25 of the chip 11, similarly to the configuration shown in FIG. 4.

Figure 6:
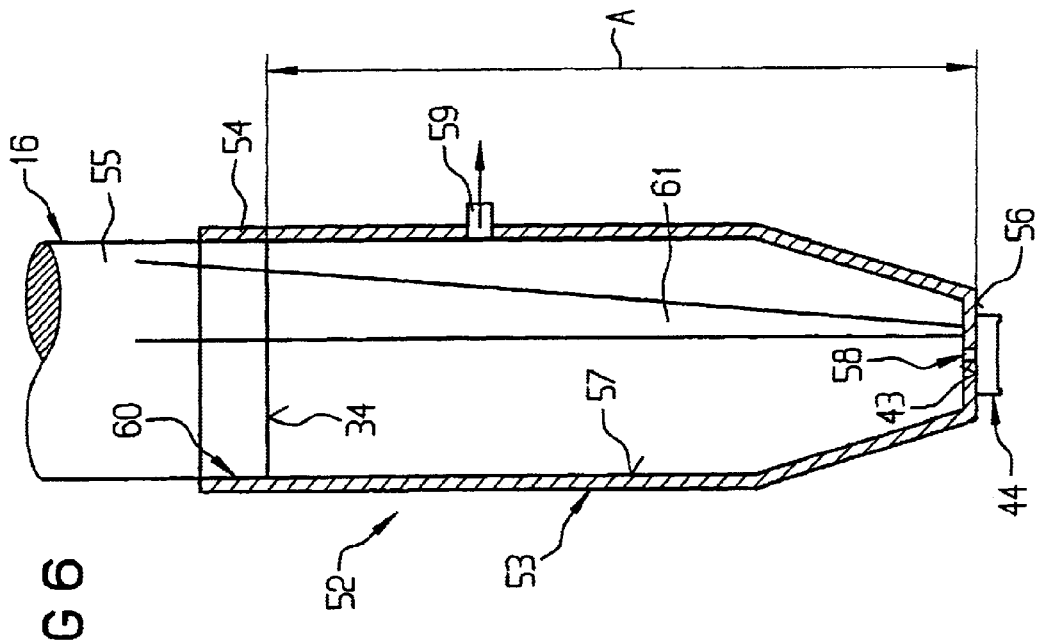
FIG. 6 is a front sectional view showing another embodiment of the contacting device.

FIG. 6 shows a contacting device 52 having a contact mouthpiece 53 that is realized as a capsule-like hollow body and connected to a fiber end section 55 of the glass fiber 16 in the region 54 of its upper circumferential edge, e.g., by means of bonding or shrinking. The contact mouthpiece 53 is realized in a transparent fashion within the region of its contact surface 56 whereas, with respect to the inner surface 57 of the contact mouthpiece 53, it is advantageous to realize this surface such that it reflects radiation.

As in the previously described contacting devices, contacting device 52 is also provided with an opening 58 in its contact surface 56. In the example shown, this opening produces a fluid connection with a pressure connection 59 that is laterally arranged on the contact mouthpiece 53, with said fluid connection extending over the entire interior of the contact mouthpiece 53 that is realized in the form of a hollow body in this case.

In the embodiment shown in FIG. 6, the transparent contact surface 56 is larger than the surface of the rear side 43 of the chip 44. In order to prevent that a laser radiation path 61 which is, for example, controlled by a scanner (not shown) extends directly onto the carrier substrate that is not shown in FIG. 6, passing the chip 44, a diaphragm or another suitable device for influencing the laser radiation path 61 may be arranged within the region of the laser radiation path 61.

FIG. 6 indicates that the contacting device 52 makes it possible to carry out the method in a particularly inexpensive fashion with respect to the costs for the device since the contacting device 52 is practically realized in the form of a fiber end cap that can be simply placed onto the fiber end section 55 of the glass fiber 16. The distance A between the fiber end cross-section 34 and the contact surface 56 can be adjusted by choosing the cap projection 60 at the connecting point between the contact mouthpiece 53 and the fiber end section 55 accordingly.

While specific embodiments of the invention have been shown and described in detail to illustrate the application of the principles of the invention, it will be understood that the invention may be embodied otherwise without departing from such principles.

What is claimed is:

1. A method for thermal connecting the terminal areas of a contact substrate to the terminal areas of a carrier substrate, the method comprising the steps of:

depositing adhesive material between the substrates in the plane of the connection;

arranging the substrates in a connecting position such that the terminal areas are situated opposite one another in the plane of the connection and substantially simultaneously displacing the adhesive material deposit arranged between the substrates in the plane of the connection with the arrangement of the contact substrate in the connecting position, said arranging of the substrates and said displacing of the adhesive simultaneously scaling a gap between the substrates;

heating the contact substrate to the connecting temperature from a rear side that is situated opposite the terminal areas in order to reach the required connecting temperature in the plane of the connection; and hating the contact substrate by subjecting the substrate to laser energy to produce a thermal connection between the terminal areas of the substrates.

2. The method according to claim 1, wherein the rear side of the substrates are respectively supported while the contact substrate is heated and while the contacting terminal areas of the substrates are situated opposite one another, with the support being realized in such a way that at least partial surface regions of the rear side are supported which lie outside of an energy receiving surface that is subjected to the laser energy.

3. The method according to claim 2, wherein the support comprises a contact surface of a contacting device that serves for connecting or for accommodating a glass fiber.

4. The method according to claim 3, wherein one of the substrates is subjected to a negative pressure via the contact surface in order to transfer the substrate into the connecting position.

5. A method for connecting a contact substrate to a carrier substrate, the method comprising the steps of:

providing a contact substrate with a terminal area;

providing a carrier substrate with a terminal area and a receiving area for receiving said contact substrate;

covering said terminal area and said receiving area of said carrier substrate with an adhesive;

placing said contact substrate on said adhesive on said carrier substrate;

moving said contact substrate through said adhesive to have said terminal area of said contact substrate move through said adhesive and cause said terminal area of said contact substrate to touch said terminal area of said carrier substrate;

heating said contact substrate on a side diametrically opposite from said carrier substrate to produce a thermal connection between said terminal areas of said substrates, said heating being performed by subjecting said contact substrate to laser energy.

6. A method in accordance with claim 5, wherein:

said placing and moving of said contact substrate includes arranging said substrates in a connecting position such that said terminal areas are situated opposite one another in a plane of a connection and substantially simultaneously displacing said adhesive arranged between said substrates in the plane of the connection with an arrangement of said contact substrate in the connecting position.

7. A method in accordance with claim 5, further comprising:

providing a contacting device;

holding said contact substrate on said contacting device;

moving said contacting device to perform said placing of said contact substrate on said adhesive and to perform said moving of said contact substrate through said adhesive.

8. A method in accordance with claim 7, wherein:

said contacting device includes an optical fiber and defines a mouthpiece;

a vacuum is generated in said mouthpiece to perform said holding of said contact substrate;

said optical fiber guides said laser energy to said contact substrate.

9. A method in accordance with claim 8, further comprising:

advancing said optical fiber toward said contact substrate in said mouthpiece to have said optical fiber arranged flush with said contact substrate.

10. A method in accordance with claim 5, wherein:

said moving of said contact substrate through said adhesive simultaneously seals a gap between said substrates.

* * * * *